US012648396B2

(12) United States Patent
Kuno et al.

(10) Patent No.: US 12,648,396 B2
(45) Date of Patent: Jun. 2, 2026

(54) WAFER PLACEMENT TABLE

(71) Applicant: NGK INSULATORS, LTD.,
Nagoya-City (JP)

(72) Inventors: Tatsuya Kuno, Nagoya-City (JP); Taro Usami, Kakamigahara-City (JP)

(73) Assignee: NGK INSULATORS, LTD., Nagoya (JP)

( * ) Notice: Subject to any disclaimer, the term of this patent is extended or adjusted under 35 U.S.C. 154(b) by 447 days.

(21) Appl. No.: 18/476,701

(22) Filed: Sep. 28, 2023

(65) Prior Publication Data

US 2024/0355656 A1      Oct. 24, 2024

Related U.S. Application Data

(63) Continuation of application No. PCT/JP2023/016096, filed on Apr. 24, 2023.

(51) Int. Cl.
H10P 72/10          (2026.01)
H01J 37/32          (2006.01)
(Continued)

(52) U.S. Cl.
CPC ........ H10P 72/127 (2026.01); H01J 37/3244 (2013.01); H01J 37/32724 (2013.01);
(Continued)

(58) Field of Classification Search
CPC .............. C23C 16/4586; H01J 37/3244; H01J 37/32715; H01J 37/32724; H10P 72/0432;
(Continued)

(56) References Cited

U.S. PATENT DOCUMENTS

2004/0177927 A1      9/2004   Kikuchi et al.
2015/0376783 A1      12/2015  Hanamachi et al.
(Continued)

FOREIGN PATENT DOCUMENTS

JP          2008-306212 A      12/2008
JP          2011-243834 A      12/2011
(Continued)

OTHER PUBLICATIONS

International Search Report and Written Opinion (Application No. PCT/JP2023/016096) dated Jul. 4, 2023 (9 pages).
(Continued)

*Primary Examiner* — Benjamin Kendall
(74) *Attorney, Agent, or Firm* — BURR PATENT LAW, PLLC

(57)          ABSTRACT
A wafer placement table includes: a ceramic plate having a wafer placement surface, a cooling plate having a refrigerant flow path and being provided on a lower surface-side of the ceramic plate; a first ceramic plate penetration section that reaches the wafer placement surface; a second ceramic plate penetration section that reaches the wafer placement surface; a first gas passage that communicates with the first ceramic plate penetration section; and a second gas passage that communicates with the second ceramic plate penetration section. The first gas passage has a first gas intermediate passage, the second gas passage has a second gas intermediate passage, the second gas intermediate passage is provided above the first gas intermediate passage, and the refrigerant flow path has a first flow path section provided above the first gas intermediate passage, and a second flow path section provided below the second gas intermediate passage.

5 Claims, 7 Drawing Sheets

(51) Int. Cl.
 *H10P 72/00*       (2026.01)
 *H10P 72/72*       (2026.01)
 *H10P 72/76*       (2026.01)
(52) U.S. Cl.
 CPC ........ *H10P 72/0602* (2026.01); *H10P 72/722*
  (2026.01); *H10P 72/7624* (2026.01)
(58) Field of Classification Search
 CPC ............. H10P 72/0434; H10P 72/0602; H10P
  72/127; H10P 72/70; H10P 72/72; H10P
  72/722; H10P 72/7616; H10P 72/7624;
  H01L 21/67103; H01L 21/67109; H01L
  21/67248; H01L 21/67309; H01L
  21/6831; H01L 21/6833; H01L 21/68757;
  H01L 21/68785
 See application file for complete search history.

(56) References Cited

U.S. PATENT DOCUMENTS

| | | |
|---|---|---|
| 2019/0013231 A1 | 1/2019 | Yamaguchi et al. |
| 2019/0035609 A1 | 1/2019 | Tobe |
| 2019/0198299 A1* | 6/2019 | Watanabe ......... H01J 37/32724 |
| 2019/0267218 A1 | 8/2019 | Wang et al. |
| 2020/0163193 A1 | 5/2020 | Ueda |
| 2020/0219753 A1 | 7/2020 | Uchida et al. |
| 2021/0175051 A1 | 6/2021 | Matsuyama |
| 2021/0272834 A1* | 9/2021 | Takayama ......... H01J 37/32724 |
| 2022/0190749 A1* | 6/2022 | Onuma .................. H02N 13/00 |
| 2022/0345054 A1 | 10/2022 | Kobayashi et al. |

FOREIGN PATENT DOCUMENTS

| | | |
|---|---|---|
| JP | 2014-175491 A | 9/2014 |
| JP | 2016-207979 A | 12/2016 |
| JP | 2017-208527 A | 11/2017 |
| JP | 2019-029373 A | 2/2019 |
| JP | 2019-117861 A | 7/2019 |
| JP | 2020-088048 A | 6/2020 |
| JP | 2021-090018 A | 6/2021 |
| JP | 2021-515392 A | 6/2021 |
| JP | 2022-164770 A | 10/2022 |
| JP | 2022-167481 A | 11/2022 |

OTHER PUBLICATIONS

English translation of the International Preliminary Report on Patentability (Chapter I) dated Nov. 6, 2025 (Application No. PCT/JP2023/016096).
Korean Notice of Opposition (Application No. 10-2023-7039823; Publication No. 10-2724770) dated Apr. 25, 2025 (35 pages).

* cited by examiner

WAFER PLACEMENT TABLE

BACKGROUND OF THE INVENTION

1. Field of the Invention

The present invention relates to a wafer placement table.

2. Description of the Related Art

Hitherto, a substrate fixing device is known, which includes: a ceramic electrostatic adsorption member having an electrode and being configured to adsorb and hold a substrate, such as a wafer, placed on an upper surface; a cooling plate provided with a gas path and a water path; and an adhesive layer for adhering the electrostatic adsorption member and the plate. In PTL 1, in the substrate fixing device, the gas path is provided so as to extend from the lower surface of the cooling plate to a position above the water path, and branches horizontally at the position to communicate with a through-hole of the electrostatic adsorption member.

CITATION LIST

Patent Literature

PTL 1: Japanese Unexamined Patent Application Publication No. 2022-167481

SUMMARY OF THE INVENTION

However, in PTL 1, a horizontally extending portion of the gas path (gas passage) is provided between the water path (refrigerant flow path) and the upper surface (wafer placement surface) of the electrostatic adsorption member, thus, for example, due to the lower limit of the distance from the water path to the wafer placement surface, the cooling efficiency of the wafer placement surface cannot be further increased, in other words, restrictions may be imposed on the adjustment of the cooling efficiency of the wafer placement surface. For this reason, the temperature distribution of the wafer placement surface may not be settable to a desired temperature distribution.

The present invention has been devised to solve such a problem, and it is a main object to facilitate setting of the temperature distribution of the wafer placement surface to a desired temperature distribution.

In order to achieve the above-mentioned main object, the present invention uses the following device.

[1] A wafer placement table of the present invention includes: a ceramic plate having a wafer placement surface at an upper surface and incorporating an electrode; a cooling plate having a refrigerant flow path and being provided on a lower surface-side of the ceramic plate; a first ceramic plate penetration section that penetrates the ceramic plate in an up-down direction and reaches the wafer placement surface; a second ceramic plate penetration section that penetrates the ceramic plate in the up-down direction and reaches the wafer placement surface; a first gas passage that is provided at least inside the cooling plate, and communicates with the first ceramic plate penetration section; and a second gas passage that is provided at least inside the cooling plate, and communicates with the second ceramic plate penetration section, wherein the first gas passage has a first gas intermediate passage extending in a direction intersecting the up-down direction, the second gas passage has a second gas intermediate passage extending in a direction intersecting the up-down, the second gas intermediate passage is provided above the first gas intermediate passage, and the refrigerant flow path has a first flow path section provided above the first gas intermediate passage, and a second flow path section provided below the second gas intermediate passage.

In this wafer placement table, the second gas intermediate passage of the second gas passage is provided above the first gas intermediate passage of the first gas passage. The refrigerant flow path has the first flow path section provided above the first gas intermediate passage, and the second flow path section provided below the second gas intermediate passage. Thus, the cooling efficiency of the wafer placement surface can be made different between the first flow path section and the second flow path section. Thus, the temperature distribution of the wafer placement surface is easily set to a desired temperature distribution by providing the first flow path section or the second flow path section according to an area where the cooling efficiency is desired to be increased or an area where the cooling efficiency is desired to be reduced on the wafer placement surface.

[2] In the above-described wafer placement table (the wafer placement table according to [1]), a plurality of first ceramic plate penetration sections, each of which is the first ceramic plate penetration section, and a plurality of second ceramic plate penetration sections, each of which is the second ceramic plate penetration section may be provided, the first gas intermediate passage may communicate with the plurality of first ceramic plate penetration sections, the second gas intermediate passage may communicate with the plurality of second ceramic plate penetration sections, the first gas passage may have one or more first gas introduction passages provided to communicate with the first gas intermediate passage, the one or more first gas introduction passages being smaller in number than a number of the plurality of first ceramic plate penetration sections, and the second gas passage may have second gas introduction passages provided to communicate with the second gas intermediate passage, the one or more second gas introduction passages being smaller in number than a number of the plurality of second ceramic plate penetration sections. In the wafer placement table, gases introduced from the first gas introduction passage and the second gas introduction passage are distributed to the plurality of first ceramic plate penetration sections and second ceramic plate penetration sections through the first gas intermediate passage and the second gas intermediate passage, respectively, and are supplied to the wafer placement surface. In order to distribute the gas and supply it to the wafer placement surface in this manner, the first gas intermediate passage and the second gas intermediate passage are needed. When the first gas intermediate passage and second gas intermediate passage have the same vertical position in this situation, restrictions are imposed on the arrangement of the refrigerant flow path, which makes it difficult to set the temperature distribution of the wafer placement surface to a desired temperature distribution, thus application of the present invention has a high significance.

[3] In the above-described wafer placement table (the wafer placement table according to [1] or [2]), the distance from the wafer placement surface to an upper base of the first flow path section may be shorter than the distance from the wafer placement surface to an upper base of the second flow path section. In this configuration, the wafer placement surface can be cooled more efficiently by the first flow path section than by the second flow path section, thus the temperature distribution of the wafer placement surface is easily adjusted by the arrangement of the first flow path section and the second flow path section.

[4] In the above-described wafer placement table (the wafer placement table according to any one of [1] to [3]), the distance from the wafer placement surface to the upper base of the first flow path section may be equal to or shorter than the distance from the wafer placement surface to a lower base of the second gas intermediate passage. In this configuration, the wafer placement surface can be cooled more efficiently by the first flow path section which is made closer to the wafer placement surface.

[5] In the above-described wafer placement table (the wafer placement table according to any one of [1] to [4]), the cooling plate may have n plate sections, the n being an integer greater than or equal to two, the wafer placement table may include first to (n–1)th bonding sections, in each of which two adjacent plates of the n plate sections are bonded to each other directly or via a bonding layer, and a nth bonding section in which the ceramic plate and the cooling plate are bonded directly or via a bonding layer, the first gas intermediate passage may be provided in one of the first to (n–1)th bonding sections, and the second gas intermediate passage may be provided in a bonding section of the first to nth bonding sections, the bonding section being above the first gas intermediate passage. In this configuration, a cooling plate having the first gas intermediate passage and the second gas intermediate passage can be produced relatively easily by a recess provided in bonding sections or a punching hole provided in bonding layers.

[6] In the above-described wafer placement table (the wafer placement table according to any one of [1] to [5]), the main component of the ceramic plate is alumina, and the main component of the cooling plate is titanium. In this configuration, alumina and titanium have relatively close thermal expansion coefficients, thus the occurrence of a problem such as warpage of the wafer placement table due to a thermal stress can be prevented. In addition, titanium has a relatively low thermal expansion coefficient, thus is a suitable material for the cooling plate of the present invention because the cooling efficiency of the wafer placement surface can be made different easily by the arrangement of the first flow path section and the second flow path section.

DETAILED DESCRIPTION OF THE INVENTION

Figure 1:
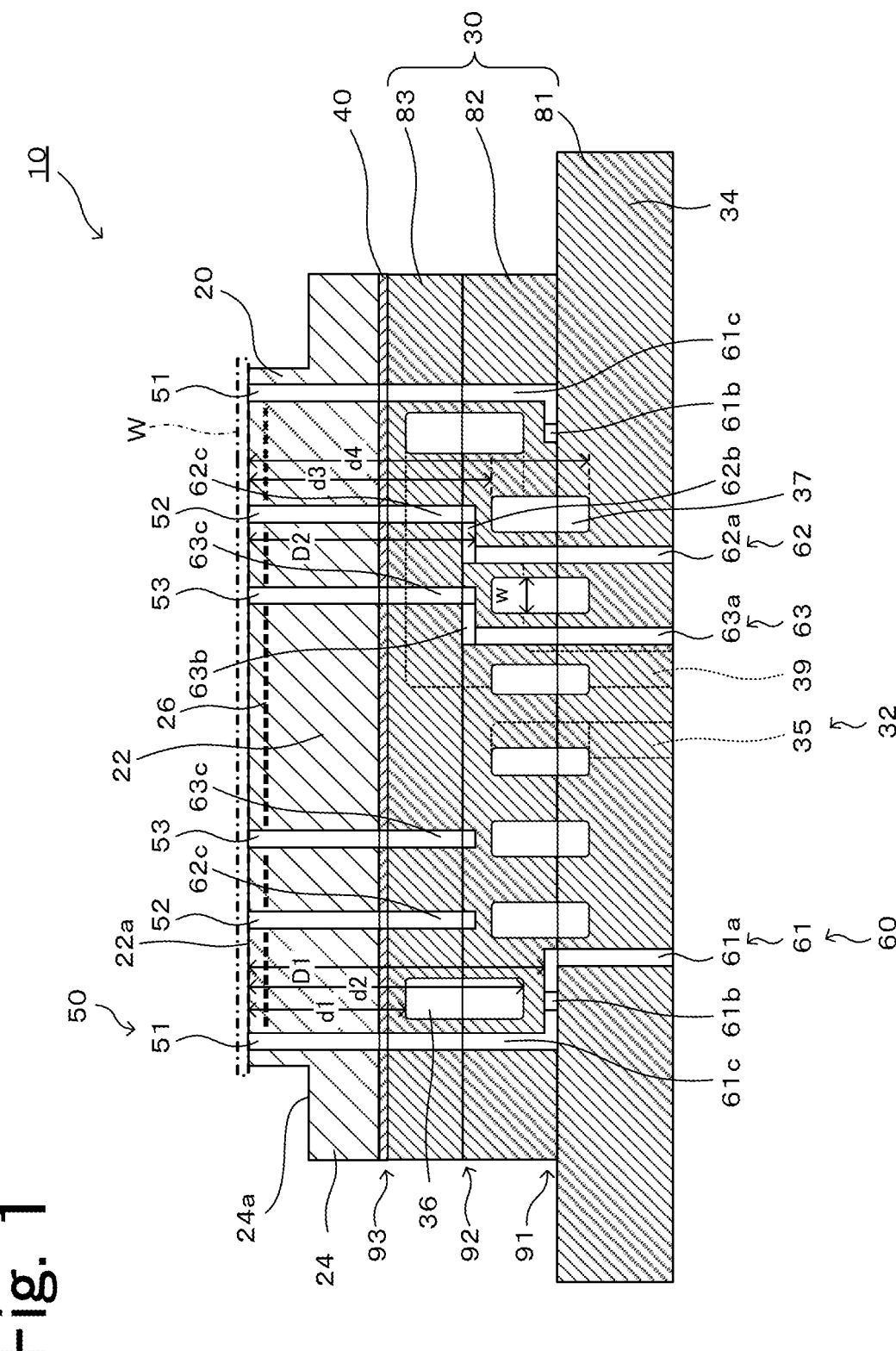
FIG. 1 is a vertical cross-sectional view of a wafer placement table 10.
Figure 2:
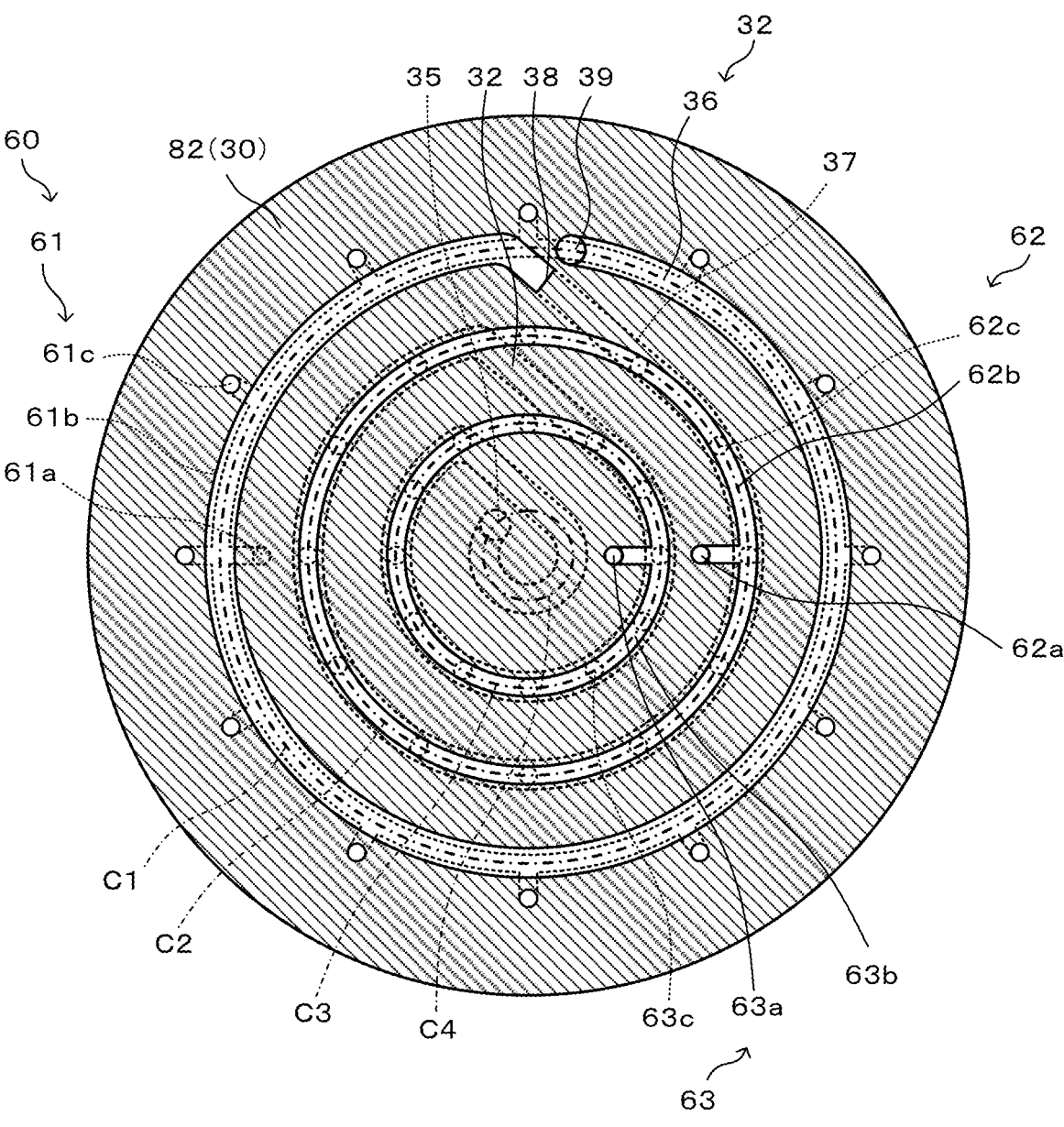
FIG. 2 is a cross-sectional view seen from above when a second plate section 82 is cut by a horizontal plane passing through gas intermediate passages 62b, 63b.
Figure 3:
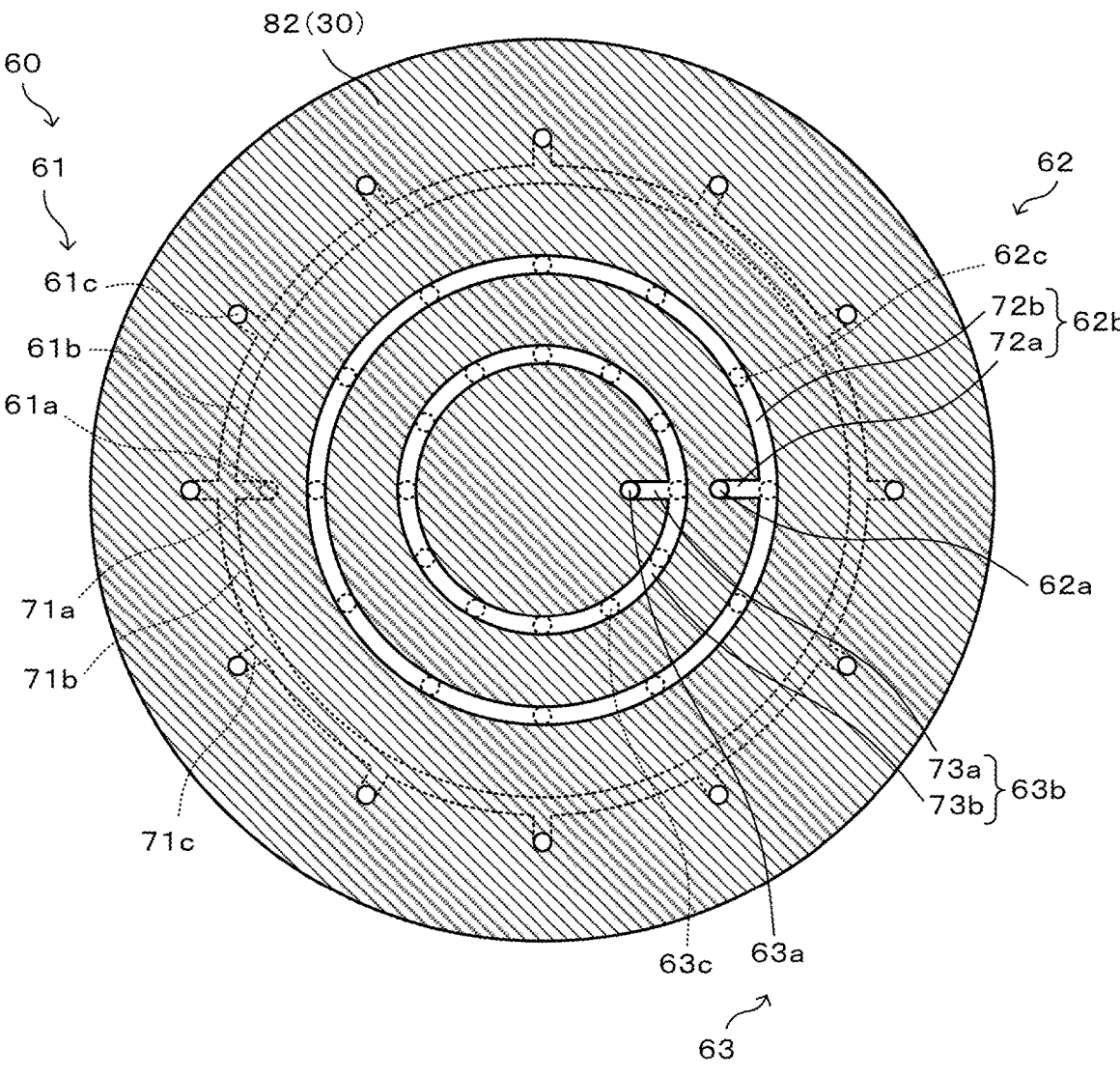
FIG. 3 is a view of FIG. 2 with a refrigerant flow path 32 omitted.
Figure 4:
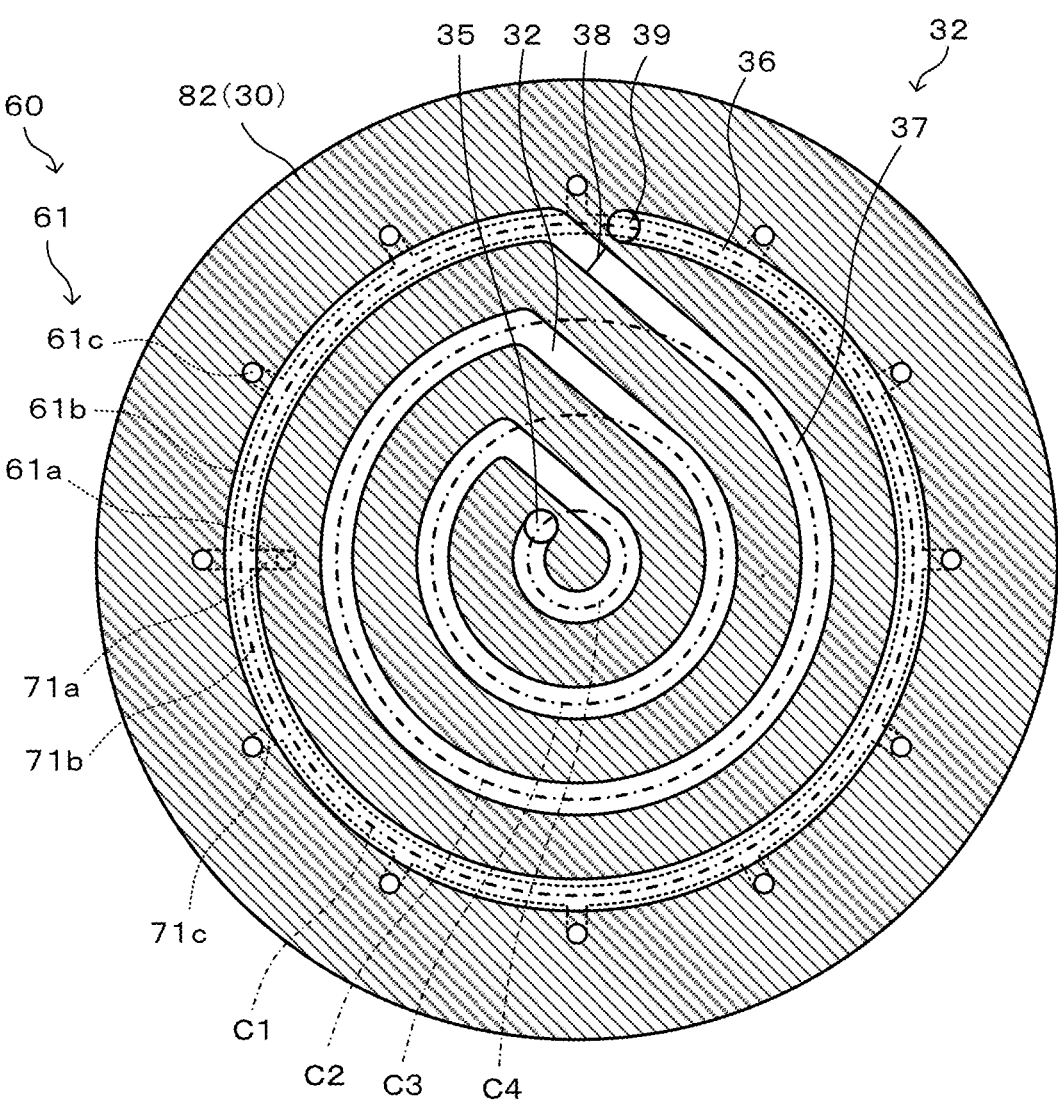
FIG. 4 is a cross-sectional view seen from above when the second plate section 82 is cut by a horizontal plane passing through the refrigerant flow path 32.

Next, a preferred embodiment of the present invention will be described using the drawings. FIG. 1 is a vertical cross-sectional view of a wafer placement table 10, FIG. 2 is a cross-sectional view seen from above when a second plate section 82 is cut by a horizontal plane passing through gas intermediate passages 62b, 63b, FIG. 3 is a view of FIG. 2 with a refrigerant flow path 32 omitted, and FIG. 4 is a cross-sectional view seen from above when the second plate section 82 is cut by a horizontal plane passing through the refrigerant flow path 32. Note that in FIG. 2 and FIG. 3, the positions of gas supply passages 62c, 63c immediately above the cross section are drawn by a dashed line.

As illustrated in FIG. 1, the wafer placement table 10 includes a ceramic plate 20, a cooling plate 30, a resin bonding layer 40, a ceramic plate penetration section 50, and a gas passage 60.

The ceramic plate 20 includes an outer peripheral section 24 on an outer periphery of a central section 22 having a circular wafer placement surface 22a, the outer peripheral section 24 having an annular focus ring placement surface 24a. Hereinafter, the focus ring may be abbreviated as "FR". A wafer W is placed on the wafer placement surface 22a, and a focus ring which is not illustrated is placed on the FR placement surface 24a. In the wafer placement surface 22a, an annular seal band (not illustrated) provided along the outer edge of the wafer placement surface 22a in a top view, and a plurality of small projections (not illustrated) provided on the entire inner surface of the seal band in a top view are formed. An area, provided with no seal band and small projection, of the wafer placement surface 22a is referred to as a reference surface. In the present specification, let the up-down direction be the direction perpendicular to the wafer placement surface 22a (more specifically, the reference surface). The ceramic plate 20 is composed of a ceramic material represented by alumina, aluminum nitride or the like. The FR placement surface 24a is lower than the wafer placement surface 22a by one step.

The central section 22 of the ceramic plate 20 incorporates a wafer attraction electrode 26 at a position near the wafer placement surface 22a. The wafer attraction electrode 26 is composed of a material containing e.g., W, Mo, WC, MoC. The wafer attraction electrode 26 is a disk-shaped or mesh-shaped unipolar electrostatic attraction electrode. Of the ceramic plate 20, the layer above the wafer attraction electrode 26 functions as a dielectric layer. The wafer attraction electrode 26 is connected to an external DC power supply through a power feeding member which is not illustrated. A low-pass filter may be disposed in the middle of the power feeding member. The power feeding member is electrically insulated from the resin bonding layer 40 and the cooling plate 30. When a DC voltage is applied to the wafer attraction electrode 26, the wafer W is attracted and fixed to the wafer placement surface 22a by an electrostatic attraction force, and when application of the DC voltage is released, attraction and fixing of the wafer W to the wafer placement surface 22a is released.

The cooling plate 30 is a disk-shaped plate having the refrigerant flow path 32 along which a refrigerant can flow, and is obtained by bonding first to third plate sections 81 to 83 to each other. The refrigerant which flows through the refrigerant flow path 32 is preferably liquid, and preferably has an electrical insulation property. As electrically insulative liquid, for example, fluorine-based inert liquid may be mentioned. The cooling plate 30 has an electrical conductivity, and is connected to a radio-frequency (RF) power supply (not illustrated), and is also used as an RF electrode. A high-pass filter may be disposed between the cooling plate 30 and the RF power supply. The cooling plate 30 has a flange section 34 on the lower surface side.

As the material for the first to third plate sections 81 to 83 of the cooling plate 30, for example, a metal material and a composite material of metal and ceramic may be mentioned. As the metal material, Al, Ti, Mo, or alloy thereof may be mentioned. As the composite material of metal and ceramic, a metal matrix composite (MMC) and a ceramic matrix composite (CMC) may be mentioned. As a specific example of such a composite material, a material containing Si, SiC and Ti (also known as SiSiCTi), a material obtained by impregnating a SiC porous body with Al and/or Si, and a composite material of $Al_2O_3$ and TiC may be mentioned. As the material for the cooling plate 30, a material having a thermal expansion coefficient closer to that of the material for the ceramic plate 20 is preferably selected. For example, when the main component of the ceramic plate 20 is alumina, the main component of the cooling plate 30 is preferably titanium (Ti). Note that the main component refers to the component which has the highest mass ratio. For example, even in the case where the cooling plate 30 is the above-mentioned composite material containing Ti, if Ti has the highest mass ratio among the entire components contained, the case is included in an aspect where the main component is Ti. In this embodiment, it is assumed that the first to third plate sections 81 to 83 are not composite materials, and the components other than inevitable impurities is Ti.

The first to third plate sections 81 to 83 are disposed in the order of the first plate section 81, the second plate section 82, and the third plate section 83 from the bottom to the top, and any two adjacent plate sections are directly bonded to each other. Specifically, the upper surface of the first plate section 81 and the lower surface of the second plate section 82 are directly bonded, and the bonding part is referred to as a first bonding section 91. In addition, the upper surface of the second plate section 82 and the lower surface of the third plate section 83 are directly bonded, and the bonding part is referred to as a second bonding section 92.

As illustrated in FIG. 4, when a cross section obtained by cutting the refrigerant flow path 32 by a horizontal plane is seen from above, the cross section is formed in a one-stroke pattern. As illustrated in FIG. 1, in the cooling plate 30, the refrigerant flow path 32 is provided in the area immediately below the wafer placement surface 22a, and is formed to be laid out over the entire area. The refrigerant flow path 32 is provided to be laid out in a one-stroke pattern from one end to the other end based on multiple circles in which a plurality of virtual circles (circles C1 to C4 are drawn with a dotted line, and the circles C1 to C4 are concentric circles, herein) with different diameters are arranged so as not to overlap with each other in a plan view. Specifically, when the refrigerant flow path 32 is laid out in a one-stroke pattern from one end to the other end, the refrigerant flow path 32 is laid out so as to trace the virtual circles, while connecting two virtual circles in an inner and outer relationship of the multiple circles. One end of the refrigerant flow path 32, located on the central side of the cooling plate 30, is connected to a refrigerant supply path 35, and the other end located on the outer peripheral side of the cooling plate 30 is connected to a refrigerant discharge path 39. The refrigerant flows in from the refrigerant supply path 35, passes through the refrigerant flow path 32, and is discharged from the refrigerant discharge path 39. The refrigerant discharged from the refrigerant discharge path 39 is adjusted in temperature by an external refrigerant circulator (not illustrated), then is returned to the refrigerant supply path 35 again.

As illustrated in FIG. 1, the distance from the wafer placement surface 22a (specifically, the above-mentioned reference surface of the wafer placement surface 22a) to the upper base of the refrigerant flow path 32, and the distance from the wafer placement surface 22a to the lower base of the refrigerant flow path 32 is not constant for the entire refrigerant flow path 32, and may be short or long depending on the location. As illustrated in FIG. 1, width w of the refrigerant flow path 32 is not constant for the entire refrigerant flow path 32, and may be narrow or wide depending on the location. Note that in FIG. 2 and FIG. 4, for the sake of convenience, the width w of the refrigerant flow path 32 is assumed to be constant for the entire refrigerant flow path 32.

The resin bonding layer 40 is a bonding layer composed of e.g., an epoxy resin, and bonds the lower surface of the ceramic plate 20 and the upper surface of the cooling plate 30. The bonding portion between the ceramic plate 20 and the cooling plate 30 via the resin bonding layer 40 is referred to as a third bonding section 93. The third bonding section 93 includes the lower surface of the ceramic plate 20, the upper surface of the cooling plate 30 (herein, the upper surface of the third plate section 83), and the resin bonding layer 40 therebetween.

The ceramic plate penetration section 50 is provided in the ceramic plate 20, and communicates with the gas passage 60. As illustrated in FIG. 1, the ceramic plate penetration section 50 has a plurality of first penetration sections 51, a plurality of second penetration sections 52, and a plurality of third penetration sections 53. The first to third penetration sections 51 to 53 are each a hole penetrating the ceramic plate 20 in the up-down direction. The first to third penetration sections 51 to 53 are each a gas passage from the lower surface of the ceramic plate 20 to the wafer placement surface 22a. The first to third penetration sections 51 to 53 are each provided so as to be open in an area (that is, the reference surface) of the wafer placement surface 22a, the area being not provided with the above-mentioned seal band and small projections. The first to third penetration sections 51 to 53 are provided corresponding to gas supply passages 61c to 63c of the gas passage 60. Specifically, the plurality of first penetration sections 51 correspond one-to-one to the plurality of gas supply passages 61c, and corresponding first penetration section 51 and gas supply passage 61c communicate with each other. Similarly, the plurality of second penetration sections 52 correspond one-to-one to and communicate with the plurality of gas supply passages 62c, and the plurality of third penetration sections 53 correspond one-to-one to and communicate with the plurality of gas supply passages 63c. The plurality of first to third penetration sections 51 to 53 are disposed immediately above corresponding gas supply passages 61c to 63c, respectively.

The gas passage 60 is provided at least inside the cooling plate 30 to communicate with the ceramic plate penetration section 50. The gas passage 60 includes the first to third passages 61 to 63. The first passage 61 communicates with the plurality of first penetration sections 51 of the ceramic plate penetration section 50, the second passage 62 communicates with the plurality of second penetration sections 52, and the third passage 63 communicates with the plurality of third penetration sections 53. The gas passage 60 is provided without passing through the refrigerant flow path 32 so as not to communicate with the refrigerant flow path 32 of the cooling plate 30.

The first passage 61 has a gas introduction passage 61a, a gas intermediate passage 61b, and a gas supply passage 61c. The gas introduction passage 61a penetrates the first plate section 81 in the up-down direction. The gas intermediate passage 61*b* is a passage extending in a direction intersecting the up-down direction. In this embodiment, the gas intermediate passage 61*b* is provided in a direction perpendicular to the up-down direction, in other words, in parallel with the wafer placement surface 22*a*. Note that "perpendicular" indicates completely perpendicular as well as not completely perpendicular within a range of acceptable error (e.g., a tolerance) but considered to be perpendicular. The same applies to "parallel". The gas intermediate passage 61*b* is provided in the first bonding section 91. More specifically, the lower surface of the second plate section 82 is provided with a bottomed groove (recessed groove), the lower surface of which is covered by the upper surface of the first plate section 81, thus the gas intermediate passage 61*b* is formed. The plurality of (12 as illustrated in FIG. 2 and FIG. 3 in this embodiment) gas supply passages 61*c* are provided. The plurality of gas supply passage 61*c* correspond one-to-one to the plurality of first penetration sections 51, and each of the plurality of gas supply passages 61*c* connects the corresponding first penetration section 51 and gas intermediate passage 61*b*. The plurality of gas supply passages 61*c* are each formed as a through-hole extending in the up-down direction. Each of the plurality of gas supply passages 61*c* includes portions which are provided inside the second plate section 82 and the third plate section 83 and penetrate these plate sections vertically, and a portion which penetrates the resin bonding layer 40 vertically.

As illustrated in FIG. 2 and FIG. 3, the gas intermediate passage 61*b* includes a gas auxiliary passage 71*a*, a gas distribution passage 71*b*, and a gas auxiliary passage 71*c*. The gas auxiliary passage 71*a* is a passage that connects the gas introduction passage 61*a* and the gas distribution passage 71*b*. As illustrated in FIG. 2 and FIG. 3, the gas distribution passage 71*b* is provided in an annular shape, and overlaps with the virtual circle C1 in a plan view. The same number (12 in this embodiment) of the gas auxiliary passages 71*c* as the number of the plurality of gas supply passages 61*c* are provided, and each gas auxiliary passage 71*c* connects a gas distribution passage 71*b* and a gas supply passage 61*c*. For one gas distribution passage 71*b*, a plural number (12, herein) of gas auxiliary passages 71*c*, gas supply passages 61*c* and first penetration sections 51 are provided; however, a number of gas introduction passages 61*a* and gas auxiliary passages 71*a* are provided, the number (herein, one for one gas distribution passage 71*b*) being fewer than the plural number.

The second passage 62 has a gas introduction passage 62*a*, a gas intermediate passage 62*b*, and a gas supply passage 62*c*. The gas introduction passage 62*a* penetrates the first plate section 81 and the second plate section 82 in the up-down direction. The gas intermediate passage 62*b* is a passage extending in a direction intersecting the up-down direction. In this embodiment, the gas intermediate passage 62*b* is provided in a direction perpendicular to the up-down direction, in other words, in parallel with the wafer placement surface 22*a*. The gas intermediate passage 62*b* is provided in the second bonding section 92, thus located above the gas intermediate passage 61*b*. More specifically, the upper surface of the second plate section 82 is provided with a bottomed groove (recessed groove), the upper surface of which is covered by the lower surface of the third plate section 83, thus the gas intermediate passage 62*b* is formed. The plurality of (12 as illustrated in FIG. 2 and FIG. 3 in this embodiment) gas supply passages 62*c* are provided. The plurality of gas supply passage 62*c* correspond one-to-one to the plurality of second penetration sections 52, and each of the plurality of gas supply passages 62*c* connects the corresponding second penetration section 52 and gas intermediate passage 62*b*. The plurality of gas supply passages 62*c* are each formed as a through-hole extending in the up-down direction. Each of the plurality of gas supply passages 62*c* includes a portion which is provided inside the third plate section 83 and penetrates the plate section vertically, and a portion which penetrates the resin bonding layer 40 vertically.

As illustrated in FIG. 2 and FIG. 3, the gas intermediate passage 62*b* includes a gas auxiliary passage 72*a*, and a gas distribution passage 72*b*. The gas auxiliary passage 72*a* is a passage that connects the gas introduction passage 62*a* and the gas distribution passage 72*b*. As illustrated in FIG. 2 and FIG. 3, the gas distribution passage 72*b* is provided in an annular shape, and overlaps with the virtual circle C2 in a plan view. The plurality of gas supply passages 62*c* are provided immediately above the gas distribution passage 72*b*, and is connected to the gas distribution passage 72*b*. For one gas distribution passage 72*b*, a plural number (12, herein) of gas supply passages 62*c* and second penetration sections 52 are provided; however, a number of gas introduction passages 62*a* and gas auxiliary passages 72*a* are provided, the number (one for one gas distribution passage 72*b*, herein) being fewer than the plural number.

The third passage 63 has a gas introduction passage 63*a*, a gas intermediate passage 63*b*, and a gas supply passage 63*c*. The gas introduction passage 63*a* penetrates the first plate section 81 and the second plate section 82 in the up-down direction. The gas intermediate passage 63*b* is a passage extending in a direction intersecting the up-down direction. In this embodiment, the gas intermediate passage 63*b* is provided in a direction perpendicular to the up-down direction, in other words, in parallel with the wafer placement surface 22*a*. As with the gas intermediate passage 62*b*, the gas intermediate passage 63*b* is provided in the second bonding section 92, thus located above the gas intermediate passage 61*b*. More specifically, the upper surface of the second plate section 82 is provided with a bottomed groove (recessed groove), the upper surface of which is covered by the lower surface of the third plate section 83, thus the gas intermediate passage 63*b* is formed. The plurality of (12 as illustrated in FIG. 2 and FIG. 3 in this embodiment) gas supply passages 63*c* are provided. The plurality of gas supply passages 63*c* correspond one-to-one to the plurality of third penetration sections 53, and each of the plurality of gas supply passages 63*c* connects the corresponding third penetration section 53 and gas intermediate passage 63*b*. The plurality of gas supply passages 63*c* are each formed as a through-hole extending in the up-down direction. Each of the plurality of gas supply passages 63*c* includes a portion which is provided inside the third plate section 83 and penetrates the plate section vertically, and a portion which penetrates the resin bonding layer 40 vertically.

As illustrated in FIG. 2 and FIG. 3, the gas intermediate passage 63*b* includes a gas auxiliary passage 73*a*, and a gas distribution passage 73*b*. The gas auxiliary passage 73*a* is a passage that connects the gas introduction passage 63*a* and the gas distribution passage 73*b*. As illustrated in FIG. 2 and FIG. 3, the gas distribution passage 73*b* is provided in an annular shape, and overlaps with the virtual circle C3 in a plan view. The plurality of gas supply passages 63*c* are provided immediately above the gas distribution passage 73*b*, and is connected to the gas distribution passage 73*b*. For one gas distribution passage 73*b*, a plural number (12, herein) of gas supply passages 63*c* and third penetration sections 53 are provided; however, a number of gas introduction passages 63a and gas auxiliary passages 73a are provided, the number (one for one gas distribution passage 73b, herein) being fewer than the plural number.

Here, the positional relationship between the refrigerant flow path 32 and the gas passage 60 will be described. The refrigerant flow path 32 has a first flow path section 36 provided above the gas intermediate passage 61b, a second flow path section 37 provided below the gas intermediate passage 62b and the gas intermediate passage 63b, and a connector 38 that connects the first flow path section 36 and the second flow path section 37. The first flow path section 36 is the portion of the refrigerant flow path 32, indicated with a solid line in FIG. 2. The first flow path section 36 includes the overlapping portion with the virtual circle C1 of the refrigerant flow path 32, and the linear portion from the virtual circle C1 to the connector 38. The overlapping portion with the virtual circle C1 of the first flow path section 36 is similarly located immediately above the gas intermediate passage 61b (particularly, the gas distribution passage 71b) overlapping with the virtual circle C1. The second flow path section 37 is the portion of the refrigerant flow path 32, indicated with a dashed line in FIG. 2. The second flow path section 37 includes a linear portion from the connector 38 to the virtual circle C2 of the refrigerant flow path 32, a portion overlapping with the virtual circles C2 to C4, and a linear portion connecting adjacent virtual circles of the virtual circles C2 to C4. The overlapping portion with the virtual circles C2, C3 of the second flow path section 37 is similarly located immediately below the gas intermediate passages 62b, 63b (particularly, the gas distribution passages 72b, 73b) overlapping with the virtual circles C2, C3. The first flow path section 36 is formed by the bottomed groove provided in the upper surface of the second plate section 82, and a bottomed groove provided in the lower surface of the third plate section 83, at a position opposed to the aforementioned bottomed groove. The second flow path section 37 is formed by a bottomed groove provided in the upper surface of the first plate section 81, and a bottomed groove provided in the lower surface of the second plate section 82, at a position opposed to the aforementioned bottomed groove.

As illustrated in FIG. 1, distance d2 from the wafer placement surface 22a to the lower base of the first flow path section 36 is shorter than distance D1 from the wafer placement surface 22a to the upper base of the gas intermediate passage 61b (i.e., d2<D1 is satisfied). In other words, the lower base of the first flow path section 36 is located above the upper base of the gas intermediate passage 61b. Thus, the first flow path section 36 is located above the gas intermediate passage 61b. In addition, distance d3 from the wafer placement surface 22a to the upper base of the second flow path section 37 is longer than distance D2 from the wafer placement surface 22a to the lower bases of the gas intermediate passages 62b, 63b (i.e., D2<d3 is satisfied). In other words, the upper base of the second flow path section 37 is located below the lower bases of the gas intermediate passages 62b, 63b. Thus, the second flow path section 37 is located below the gas intermediate passage 62b and the gas intermediate passage 63b.

In addition, distance d1 from the wafer placement surface 22a to the upper base of the first flow path section 36 is shorter than above-mentioned distance d3 (i.e., d1<d3 is satisfied). In other words, the upper base of the first flow path section 36 is located above the upper base of the second flow path section 37. In this embodiment, the distance d1 is assumed to have the same value at any position of the first flow path section 36, and the distance d3 is assumed to have the same value at any position of the second flow path section 37. Similarly, the above-mentioned distance d2 is shorter than distance d4 from the wafer placement surface 22a to the lower base of the second flow path section 37 (i.e., d2<d4 is satisfied). In other words, the lower base of the first flow path section 36 is located above the lower base of the second flow path section 37. In this embodiment, the distance d2 is assumed to have the same value at any position of the first flow path section 36, and the distance d4 is assumed to have the same value at any position of the second flow path section 37. The distance d2 is longer than the distance d3 (i.e., d3<d2 is satisfied). Thus, in this embodiment, the distances d1 to d4 satisfy d1<d3<d2<d4. The connector 38 have the upper base and the lower base each provided with a step, thus connects the first flow path section 36 and the second flow path section 37. The connector 38 may connect the first flow path section 36 and the second flow path section 37 by being provided with an inclined section along which the upper base and the lower base are gradually changed.

The distance d1 is the same as the above-mentioned distance D2 or shorter than the distance D2 (i.e., d1 D2 is satisfied). In other words, at least part of the area from the upper base to the lower base of the first flow path section 36 is located at the same position as or above the lower bases of the gas intermediate passages 62b, 63b. Note that the distance d1 and the distance D2 are the "same" indicates completely the same as well as not completely the same but the difference between the distance d1 and the distance D2 is within a range of acceptable error (e.g., a tolerance), and considered to be the same if the distance d1 and the distance D2 are comparable. In this embodiment, as illustrated in FIG. 1, the distance d1 is shorter than the distance D2 (i.e., d1<D2 is satisfied). In this embodiment, the distance D2 is assumed to have the same value at any position of the gas intermediate passages 62b, 63b. The distance d4 is the same as the above-mentioned distance D1 or longer than the distance D1 (i.e., D1≤d4 is satisfied). In other words, at least part of the area from the upper base to the lower base of the second flow path section 37 is located at the same position as or below the upper base of the gas intermediate passages 61b. Note that the distance d4 and the distance D1 are the "same" indicates completely the same as well as not completely the same but the difference between the distance d4 and the distance D1 is within a range of acceptable error (e.g., a tolerance), and considered to be the same if the distance d4 and the distance D1 are comparable. In this embodiment, as illustrated in FIG. 1, the distance d4 is longer than the distance D1 (i.e., D1<d4 is satisfied). In this embodiment, the distance D1 is assumed to have the same value at any position of the gas intermediate passage 61b.

Next, a manufacturing example of the wafer placement table 10 will be described using FIGS. 5A to 5E and FIGS. 6A to 6C. FIGS. 5A to 5E are manufacturing process diagrams for the wafer placement table 10, and FIGS. 6A to 6C are machining process diagrams for the first to third plate sections 81 to 83.

Figures 5A, 5B, 5C, 5D, 5E:
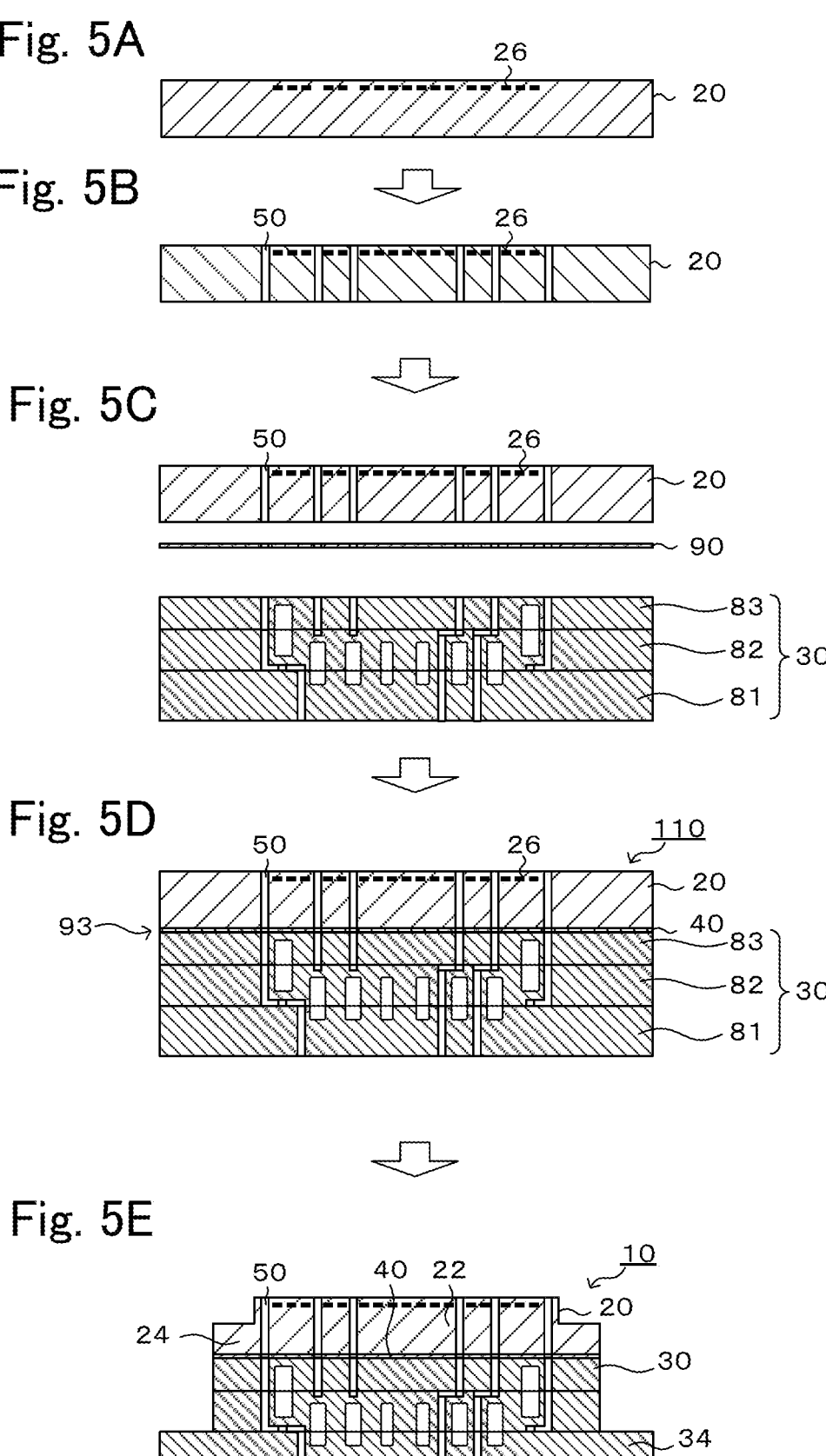
FIGS. 5A to 5E are manufacturing process diagrams for the wafer placement table 10.

First, the ceramic plate 20 is produced by hot-press firing a molded body of ceramic powder (alumina powder in this embodiment) (FIG. 5A). The ceramic plate 20 incorporates the wafer attraction electrode 26. Next, the ceramic plate penetration section 50 is formed in the ceramic plate 20 (FIG. 5B). The ceramic plate penetration section 50 is formed so as to penetrate the ceramic plate 20 in the up-down direction without passing through the wafer attraction electrode 26.

Figures 6A, 6B, 6C:
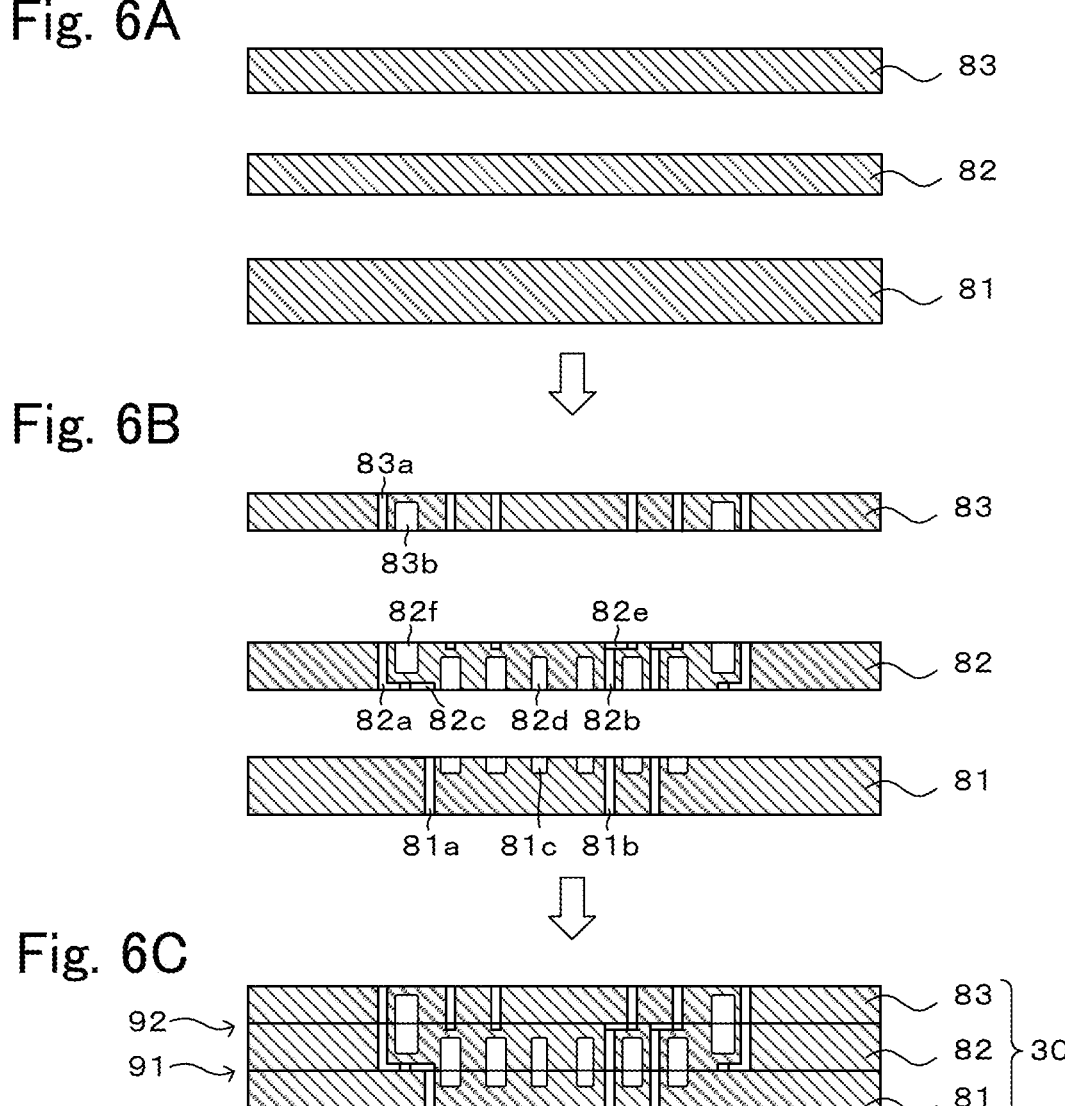
FIGS. 6A to 6C are machining process diagrams for first to third plate sections 81 to 83.

Concurrently with this step, the first to third plate sections 81 to 83 are prepared which are disc members without hole and groove (FIG. 6A). In this embodiment, three pieces of Ti disc members are prepared, and let them be the first to third plate sections 81 to 83. Then, through-holes and grooves are formed in these first to third plate sections 81 to 83 as appropriate by machining processing (FIG. 6B). For example, a through-hole 81a, which finally becomes the gas introduction passage 61a, and two through-holes 81b, which finally become part of the gas introduction passages 62a, 63a, are formed in the first plate section 81. In addition, a bottomed groove 81c, which finally becomes part of the second flow path section 37, is formed in the upper surface of the first plate section 81. A plurality of through-holes 82a, which finally become part of the plurality of gas supply passages 61c, and two through-holes 82b, which finally become part of the gas introduction passages 62a, 63a, are formed in the second plate section 82. In addition, a bottomed groove 82c, which finally becomes the gas intermediate passage 61b, and a bottomed groove 82d, which finally becomes part of the second flow path section 37, are formed in the lower surface of the second plate section 82. A bottomed groove 82e, which finally becomes the gas intermediate passages 62b, 63b, and a bottomed groove 82f, which finally becomes part of the first flow path section 36, are formed in the upper surface of the second plate section 82. A plurality of through-holes 83a, which finally become part of the plurality of gas supply passages 61c to 63c, are formed in the third plate section 83. In addition, a bottomed groove 83b, which finally becomes part of the first flow path section 36, is formed in the lower surface of the third plate section 83.

Next, the first to third plate sections 81 to 83 are layered and bonded (FIG. 6C). As a bonding method, for example, diffusion bonding can be used. The diffusion bonding is a publicly known method by which metals (the first to third plate sections 81 to 83, that is, Ti in this case) are brought into direct contact, and bonded by metal diffusion between bonding surfaces at a temperature lower than the melting point of the metal in a pressurized state which allows plastic deformation to occur as little as possible. Consequently, formation of the first bonding section 91 causes the first plate section 81 and the second plate section 82 to be bonded, and formation of the second bonding section 92 causes the second plate section 82 and the third plate section 83 to be bonded, thus the cooling plate 30 is obtained.

Returning to FIGS. 5A to 5E, after the ceramic plate penetration section 50 is formed, a resin sheet 90 is placed between the lower surface of the ceramic plate 20 and the upper surface of the cooling plate 30, and these are layered (FIG. 5C). In the resin sheet 90, through-holes are opened in advance at the positions opposed to the ceramic plate penetration section 50 of the ceramic plate 20 and the through-holes (part of the gas supply passages 61c to 63c) of the third plate section 83. The layered body obtained in this manner is pressurized while being heated, thus the ceramic plate 20 and the cooling plate 30 are bonded with the resin sheet 90. Consequently, the resin sheet 90 becomes the resin bonding layer 40, and the third bonding section 93 is formed in which the lower surface of the ceramic plate 20 and the upper surface of the cooling plate 30 are bonded via the resin bonding layer 40, thus a bonding body 110 is obtained (FIG. 5D).

As the resin sheet 90, for example, an epoxy resin may be used. It is preferable to use the resin sheet 90 with a thickness of around 100 μm. The through-holes opened in advance in the resin sheet 90 may be deformed at the time of bonding, thus are preferably larger in diameter than the ceramic plate penetration section 50 and the through-holes of the third plate section 83.

Subsequently, the outer periphery of the ceramic plate 20 is cut to form a step, thus a structure including the central section 22 and the outer peripheral section 24 is implemented. In addition, the outer periphery of the cooling plate 30 is cut to form a step, thus a structure including the flange section 34 is implemented. Consequently, the wafer placement table 10 is obtained (FIG. 5E).

Next, an example of use of the wafer placement table 10 will be described. First, with the wafer placement table 10 installed in a chamber which is not illustrated, a focus ring is placed on the FR placement surface 24a, and the wafer W is placed on the wafer placement surface 22a. The chamber is then depressurized and adjusted by a vacuum pump so as to achieve a predetermined degree of vacuum, a DC voltage is applied to the wafer attraction electrode 26 of the ceramic plate 20 to generate an electrostatic attraction force, thus the wafer W is attracted and fixed to the wafer placement surface 22a (specifically, the upper surface of the seal band and the upper surfaces of the small projections). Next, a reactive gas atmosphere with a predetermined pressure (e.g., several 10 to several 100 Pa) is attained in the chamber, and with this state, an RF voltage is applied across an upper electrode (not illustrated) provided in the ceiling portion in the chamber and the cooling plate 30 of the wafer placement table 10 to generate a plasma. The surface of the wafer W is processed by the generated plasma. A refrigerant is circulated through the refrigerant flow path 32 of the cooling plate 30. A backside gas is introduced into the gas introduction passages 61a to 63a of the gas passage 60 from a gas cylinder which is not illustrated. As the backside gas, a heat transfer gas (e.g., He gas) is used. The backside gas introduced into the gas introduction passage 61a is distributed to a plurality of gas supply passages 61c through the gas intermediate passage 61b, and is passed through a plurality of first penetration sections 51, then is supplied and sealed in the space between the back surface of the wafer W and the reference surface of the wafer placement surface 22a. Similarly, the backside gas introduced into the gas introduction passage 62a and the gas introduction passage 63a is distributed to a plurality of gas supply passages 62c and gas supply passages 63c through the gas intermediate passage 62b and the gas intermediate passage 63b, and is passed through a plurality of second penetration sections 52 and third penetration sections 53, then is supplied and sealed in the space between the back surface of the wafer W and the reference surface of the wafer placement surface 22a. Due to the presence of the backside gas, heat is efficiently transferred between the wafer W and the ceramic plate 20. Note that the focus ring also wears out with plasma treatment of the wafer W, but the focus ring is thicker than the wafer W, thus the focus ring is replaced after several wafers W are processed.

As described above, the refrigerant flow path 32 has the first flow path section 36 provided above the gas intermediate passage 61b, and the second flow path section 37 provided below the gas intermediate passage 62b and the gas intermediate passage 63b. Thus, when plasma treatment is performed on the wafer W using the wafer placement table 10, the cooling efficiency of the wafer placement surface 22a can be made different between the first flow path section 36 and the second flow path section 37. Thus, the temperature distribution of the wafer placement surface 22a is easily set to a desired temperature distribution by providing the first flow path section 36 or the second flow path section 37 according to an area where the cooling efficiency is desired to be increased or an area where the cooling efficiency is desired to be reduced on the wafer placement surface 22a. Consequently, the temperature distribution of the wafer W is easily set to a desired temperature distribution. For example, in this embodiment, the first flow path section 36 is provided near the outer periphery of the wafer placement surface 22a, and the second flow path section 37 is provided closer to the center of the wafer placement surface 22a than the first flow path section 36 in a top view. In addition, the distance d1 is shorter than the distance d3, in other words, the first flow path section 36 is closer to the wafer placement surface 22a than the second flow path section 37. Because of this, the first flow path section 36 can cool the wafer placement surface 22a more efficiently than the second flow path section 37, thus the vicinity of the outer periphery of the wafer placement surface 22a can be cooled more efficiently than the center thereof. Thus, for example when the temperature near the outer periphery of the wafer W is likely to increase, the thermal uniformity of the wafer W can be improved. Alternatively, it is also possible to set a temperature distribution in which the vicinity of the outer periphery of the wafer W is lower in temperature than the center thereof.

Furthermore, the cooling efficiency of the wafer placement surface 22a achieved by the refrigerant flow path 32 is adjustable by adjusting the flow path cross section of the refrigerant flow path 32. In a region where the flow path cross-sectional area is small, the pressure loss increases, and heat exchange between the refrigerant and the wafer W is promoted, thus the cooling efficiency is increased. The flow path cross-sectional area is adjustable by changing at least one of the difference between the distance d1 and the distance d2, the difference between the distance d3 and the distance d4, and the width w, for example. Therefore, the temperature distribution of the wafer placement surface 22a can be set to a more desired temperature distribution by adjusting the flow path cross-sectional area according to an area where the cooling efficiency is desired to be increased or an area where the cooling efficiency is desired to be reduced of the refrigerant flow path 32.

In the above-described embodiment, the first penetration section 51 corresponds to a first ceramic plate penetration section, the second penetration section 52 and the third penetration section 53 each correspond to a second ceramic plate penetration section, the first passage 61 corresponds to a first gas passage, the second passage 62 and the third passage 63 each correspond to a second gas passage, the gas intermediate passage 61b corresponds to a first gas intermediate passage, and the gas intermediate passage 62b and the gas intermediate passage 63b each correspond to a second gas intermediate passage. The gas introduction passage 61a corresponds to a first gas introduction passage, and the gas introduction passage 62a and the gas introduction passage 63a each correspond to a second gas introduction passage.

In the wafer placement table 10 in this embodiment described in detail above, the gas intermediate passage 62b of the second passage 62 and the gas intermediate passage 63b of the third passage 63 are each provided above the gas intermediate passage 61b of the first passage 61. The refrigerant flow path 32 has the first flow path section 36 provided above the gas intermediate passage 61b, and the second flow path section 37 provided below the gas intermediate passage 62b and the gas intermediate passage 63b. Consequently, the cooling efficiency of the wafer placement surface 22a can be made different between the first flow path section 36 and the second flow path section 37. Thus, the temperature distribution of the wafer placement surface 22a is easily set to a desired temperature distribution by providing the first flow path section 36 or the second flow path section 37 according to an area where the cooling efficiency is desired to be increased or an area where the cooling efficiency is desired to be reduced on the wafer placement surface 22a.

The gas introduced from the gas introduction passage 61a is distributed to the plurality of first penetration sections 51 through the gas intermediate passage 61b, and is supplied to the wafer placement surface 22a. Similarly, the gas introduced from the gas introduction passage 62a is distributed to the plurality of second penetration sections 52 through the gas intermediate passage 62b, and is supplied to the wafer placement surface 22a, and the gas introduced from the gas introduction passage 63a is distributed to the plurality of third penetration sections 53 through the gas intermediate passage 63b, and is supplied to the wafer placement surface 22a. In order to distribute the gas by each of the first to third passages 61 to 63 and supply the gas to the wafer placement surface 22a in this manner, each of the first to third passages 61 to 63 cannot be only a through-hole in the up-down direction, and the gas intermediate passages 61b to 63b extending in a direction intersecting the up-down direction are needed. If the gas intermediate passages 61b to 63b have the same vertical position in this situation, restrictions are imposed on the arrangement of the refrigerant flow path 32. For example, when the refrigerant flow path 32 is provided in a one-stroke pattern, it is difficult to provide it so that the refrigerant flow path 32 passes both above and below the gas intermediate passages 61b to 63b without passing through the gas introduction passages 61a to 63a and the gas supply passages 61c to 63c. As a result, it is difficult to set the temperature distribution of the wafer placement surface 22a to a desired temperature distribution. In contrast, when the gas intermediate passages 62b, 63b are provided above the gas intermediate passage 61b by applying the present invention, even if the first flow path section 36 is provided above the gas intermediate passage 61b and the second flow path section 37 is provided below the gas intermediate passages 62b, 63b, it is easy to prevent the refrigerant flow path 32 from passing through the gas introduction passages 61a to 63a and the gas supply passages 61c to 63c. As a result, the temperature distribution of the wafer placement surface 22a is easily set to a desired temperature distribution by the first flow path section 36 and the second flow path section 37. When the gas intermediate passages 61b to 63b for distributing the gas are provided in this manner, application of the present invention has a high significance.

Furthermore, the distance d1 from the wafer placement surface 22a to the upper base of the first flow path section 36 is shorter than the distance d3 from the wafer placement surface 22a to the upper base of the second flow path section 37. Thus, the first flow path section 36 can cool the wafer placement surface 22a more efficiently than the second flow path section 37, thus the temperature distribution of the wafer placement surface 22a is easily adjusted by the arrangement of the first flow path section 36 and the second flow path section 37.

Furthermore, the distance d1 from the wafer placement surface 22a to the upper base of the first flow path section 36 is the same as or shorter than the distance D2 from the wafer placement surface 22a to the lower bases of the gas intermediate passage 62b and the gas intermediate passage 63b. Therefore, the first flow path section 36 is closer to the wafer placement surface 22a, thus the wafer placement surface 22a can be cooled more efficiently.

The cooling plate 30 has three plate sections (the first to third plate sections 81 to 83). The wafer placement table 10 includes the first and second bonding sections 91 and 92, in each of which two adjacent plate sections of three plate sections are directly bonded to each other, and the third bonding section 93 in which the ceramic plate 20 and the cooling plate 30 are bonded via the resin bonding layer 40. The gas intermediate passage 61*b* is provided in the first bonding section 91, and the gas intermediate passage 62*b* and the gas intermediate passage 63*b* are each provided in the second bonding section 92 above the first bonding section 91. The gas intermediate passages 62*b*, 63*b* are provided above the gas intermediate passage 61*b* in this manner, and each of the gas intermediate passages 61*b* to 63*b* is provided in one of the first to third bonding sections 91 to 93, thus the cooling plate 30 having the gas intermediate passages 61*b* to 63*b* can be manufactured relatively easily by the bottomed groove (recess) provided in each bonding section.

The main component of the ceramic plate 20 is alumina, and the main component of the cooling plate 30 is titanium. Due to this, alumina and titanium have relatively close thermal expansion coefficients, thus the occurrence of a problem such as warpage of the wafer placement table 10 due to a thermal stress can be prevented. In addition, titanium has a relatively lower thermal expansion coefficient than aluminum, thus the cooling efficiency of the wafer placement surface 22*a* can be made different relatively easily by the arrangement (for example, by setting differentiated distance d1 and distance d3) of the first flow path section 36 and the second flow path section 37. Therefore, titanium is a suitable material for the cooling plate 30.

The present invention is not limited to the above-described embodiment, and can be carried out by various modes as long as they belong to the technical scope of the invention.

For example, in the above-described embodiment, the ceramic plate 20 and the cooling plate 30 are bonded by the resin bonding layer 40; however, a conductive bonding layer may be used instead of the resin bonding layer 40. As the conductive bonding layer, for example, a metal bonding layer may be used. The metal bonding layer may be formed, for example, by TCB (Thermal compression bonding). TCB refers to a publicly known method by which a metal bonding material is interposed between two members to be bonded, and the two members are pressure-bonded with heated to a temperature lower than or equal to the solidus temperature of the metal bonding material. For example, TCB is performed in the following manner. In FIG. 5C, a metal bonding material is prepared instead of the resin sheet 90, and the ceramic plate 20, the metal bonding material and the cooling plate 30 are layered to obtain a layered body. The layered body is pressurized and bonded at a temperature (for example, a temperature between the solidus temperature minus 20° C. and the solidus temperature, inclusively) lower than or equal to the solidus temperature of the metal bonding material, and subsequently, the temperature is returned to room temperature. Consequently, the metal bonding material becomes a conductive bonding layer, and the lower surface of the ceramic plate 20 and the upper surface of the cooling plate 30 are bonded via the conductive bonding layer. As the metal bonding material, an Al—Mg-based bonding material and an Al—Si—Mg-based bonding material may be used. For example, when TCB is performed using an Al—Si—Mg-based bonding material, the layered body is pressurized with heated in a vacuum atmosphere. It is preferable to use a metal bonding material with a thickness of around 100 μm.

Figure 7:
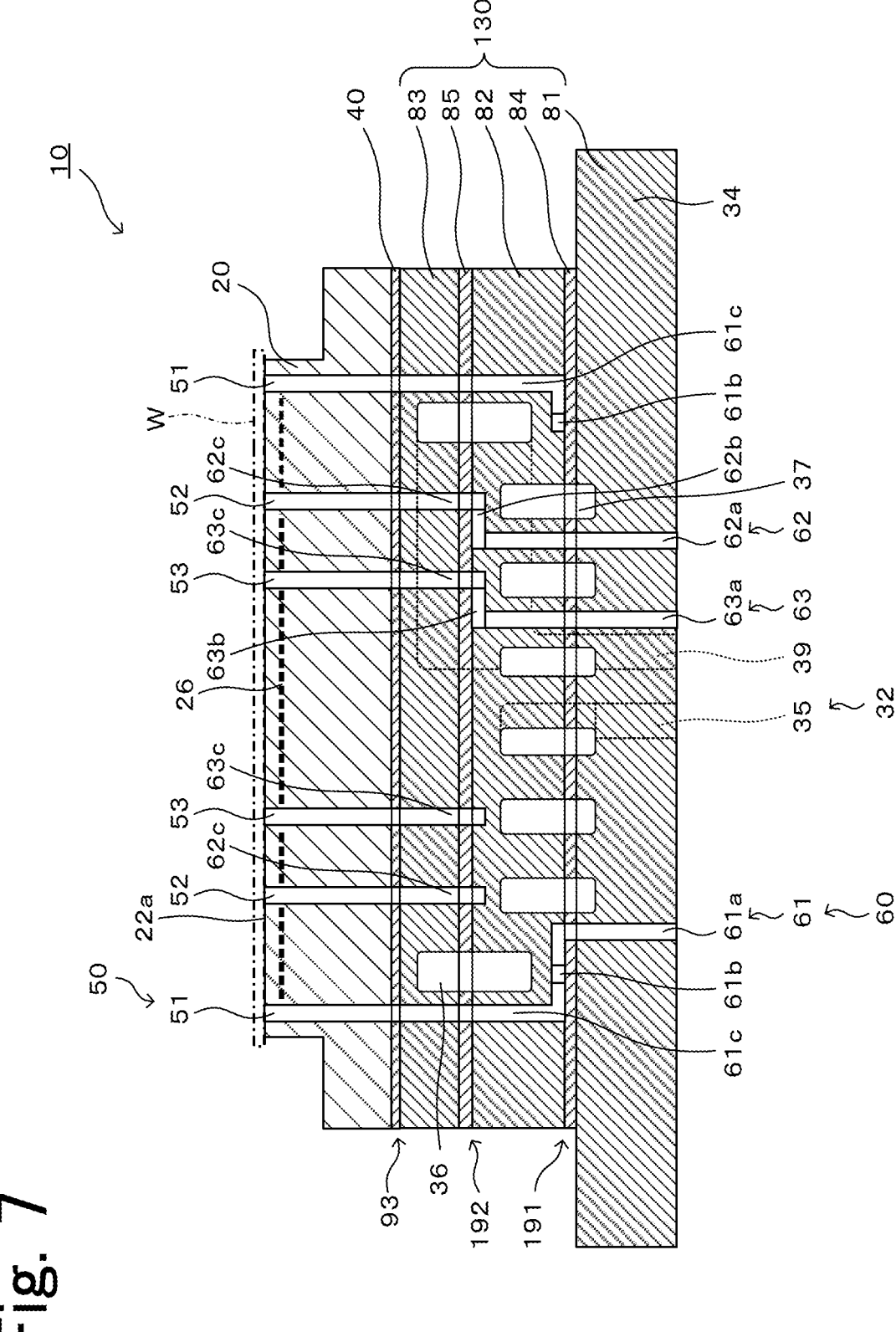
FIG. 7 is a vertical cross-sectional view of the wafer placement table 10 including a cooling plate 130.

In the above-described embodiment, any two adjacent plate sections are directly bonded to each other in the first to third plate sections 81 to 83; however, without being limited to this, at least two of the first to third plate sections 81 to 83 may be bonded to each other via an adhesive layer. For example, in the above-described embodiment, cooling plate 130 illustrated in FIG. 7 may be used instead of the cooling plate 30. In FIG. 7, the same components as in the above-described embodiment are labeled with the same symbol. In addition to the first to third plate sections 81 to 83, the cooling plate 130 includes a first inner bonding layer 84 that bonds the first plate section 81 and the second plate section 82, and a second inner bonding layer 85 that bonds the second plate section 82 and the third plate section 83. A section in which the first plate section 81 and the second plate section 82 are bonded via the first inner bonding layer 84 is referred to as a first bonding section 191. The first bonding section 191 includes the upper surface of the first plate section 81, the lower surface of the second plate section 82, and the first inner bonding layer 84 therebetween. A section in which the second plate section 82 and the third plate section 83 are bonded via the second inner bonding layer 85 is referred to as a second bonding section 192. The second bonding section 192 includes the upper surface of the second plate section 82, the lower surface of the third plate section 83, and the second inner bonding layer 85 therebetween. The first inner bonding layer 84 and the second inner bonding layer 85 are provided with through-holes serving as part of the above-mentioned gas passage 60 and refrigerant flow path 32 as needed. For example, in FIG. 7, the gas introduction passage 61*a* penetrates the first plate section 81 and the first inner bonding layer 84 in the up-down direction. The gas introduction passages 62*a*, 63*a* each penetrate the first plate section 81, the second plate section 82, and the first inner bonding layer 84 therebetween in the up-down direction. The first flow path section 36 is formed by bottomed grooves provided in the upper surface of the second plate section 82, through-holes provided in the second inner bonding layer 85 at positions opposed to the bottomed grooves, and bottomed grooves provided in the lower surface of the third plate section 83 at positions opposed to the through-holes. The gas intermediate passage 61*b* is provided in the first bonding section 191. More specifically, the bottomed grooves (recessed grooves) provided in the lower surface of the second plate section 82 are covered by the upper surface of the first inner bonding layer 84, thereby forming the gas intermediate passage 61*b*. The first inner bonding layer 84 and the second inner bonding layer 85 can be formed in the same manner as the above-described conductive bonding layer.

In the above-described embodiment, the cooling plate 30 and the ceramic plate 20 are bonded via the resin bonding layer 40; however, without being limited to this, the cooling plate 30 and the ceramic plate 20 may be directly bonded. In this case, the third bonding section 93 includes the upper surface of the cooling plate 30 and the lower surface of the ceramic plate 20.

In the above-described embodiment, the cooling plate 30 has the first to third plate sections 81 to 83; however, without being limited to this, the cooling plate 30 may have n plate sections, the n being an integer greater than or equal to two. In this case, let first to (n–1)th bonding sections be the bonding sections, at each of which adjacent two plate sections of the n plate sections are directly bonded to each other or bonded via a bonding layer. In addition, let nth bonding section be the bonding section, at which the ceramic plate 20 and the cooling plate 30 are directly bonded or bonded via a bonding layer. In this case, the first gas intermediate passage may be provided in one of the first to (n−1)th bonding sections, and the second gas intermediate passage may be provided in one of the first to nth bonding sections, above the first gas intermediate passage. In this manner, even when the cooling plate 30 has n plate sections, the same effect as in the above-described embodiment is obtained. Specifically, the second gas intermediate passage is provided above the first gas intermediate passage, and each of the first and second gas intermediate passages is provided in one of the first to nth bonding sections, thus the cooling plate 30 having the first and second gas intermediate passages can be manufactured relatively easily.

In the above-described embodiment, the gas intermediate passage 61*b* provided in the first bonding section 91 is configured to be formed by the bottomed grooves provided in the lower surface of the second plate section 82 and the upper surface of the first plate section 81, but the configuration is not limited thereto. For example, an aspect may be adopted in which the gas intermediate passage 61*b* is formed by the bottomed grooves provided in the upper surface of the first plate section 81 and the lower surface of the second plate section 82, or an aspect may be adopted in which the gas intermediate passage 61*b* is formed by the bottomed grooves provided in the upper surface of the first plate section 81 and the bottomed grooves provided in the lower surface of the second plate section 82. When the first inner bonding layer 84 is present as illustrated in FIG. 7, in one of these aspects, the through-holes of the first inner bonding layer 84 may further constitute part of the gas intermediate passage 61*b*. In addition, an aspect may be adopted in which part of the gas intermediate passage 61*b* is formed by the bottomed grooves formed in the first inner bonding layer 84. For example, the gas intermediate passage 61*b* may be formed by the bottomed grooves formed in the upper surface of the first inner bonding layer 84, and the lower surface of the second plate section 82 or the bottomed grooves formed in the lower surface of the second plate section 82. These aspects each correspond to a specific example of the gas intermediate passage 61*b* provided in the first bonding section 91. The same applies to the gas intermediate passages 62*b*, 63*b* provided in the second bonding section 92. The same applies when at least one of the gas intermediate passages 62*b*, 63*b* is provided in the third bonding section 93. For example, an aspect may be adopted in which the gas intermediate passage 63*b* is formed by the bottomed grooves provided in the upper surface of the third plate section 83 and the lower surface of the resin bonding layer 40, or an aspect may be adopted in which the gas intermediate passage 63*b* is formed by the bottomed grooves provided in the upper surface of the third plate section 83 and the bottomed grooves provided in the lower surface of the resin bonding layer 40, or an aspect may be adopted in which the gas intermediate passage 63*b* is formed by the upper surface of the third plate section 83 and the bottomed grooves provided in the lower surface of the resin bonding layer 40, or an aspect may be adopted in which the gas intermediate passage 63*b* is formed by the upper surface of the third plate section 83, the through-holes provided in the resin bonding layer 40 and the lower surface of the ceramic plate 20.

In the above-described embodiment, the gas intermediate passages 61*b* to 63*b* are each provided in the first bonding section 91 or the second bonding section 92; however, in a state after the wafer placement table 10 is manufactured, one or more of the first bonding section 91 and the second bonding section 92 may be unidentifiable. In other words, when the first to third plate sections 81 to 83 are composed of the same material, the interface between the first plate section 81 and the second plate section 82, and the interface between the second plate section 82 and the third plate section 83 may be unidentifiable depending on the state of the cooling plate 30. When one or more of the first bonding section 91 and the second bonding section 92 are unidentifiable, it can be regarded that the cooling plate 30 does not include the unidentifiable bonding sections. For example, when any of the inner bonding sections of the cooling plate 30 is unidentifiable, for example when the first bonding section 91 and the second bonding section 92 are unidentifiable, it can be regarded that the cooling plate 30 does not include a plurality of plate sections, and is comprised of a single plate section.

In the above-described embodiment, for the distances d1 to d4 and the distances D1, D2, it is assumed that d1<d3, d2<d4, d3<d2, d1<d3<d2<d4, d1≤D2, D1≤d4 are all met; however, without being limited to this, one or more of these inequalities may not be met. Also, in this case, it is sufficient that the gas intermediate passages 62*b*, 63*b* be provided above the gas intermediate passage 61*b*, the first flow path section 36 be provided above the gas intermediate passage 61*b* (i.e., d2<D1 is satisfied), and the second flow path section 37 be provided below the gas intermediate passages 62*b*, 63*b* (i.e., D2<d3 is satisfied). For example, it is sufficient that d1=d3 or d1>d3. For example, even when d1=d3, the gas passage 60 is not present immediately above the first flow path section 36, whereas the gas intermediate passages 62*b*, 63*b* or the gas supply passages 62*c*, 63*c* are present immediately above at least part of the second flow path section 37. Thus, as compared to the first flow path section 36, the cooling efficiency of the wafer placement surface 22*a* is likely to reduce in part of the second flow path section 37, where the gas intermediate passages 62*b*, 63*b* or the gas supply passages 62*c*, 63*c* are present immediately above the part. Thus, even when d1=d3, the temperature distribution of the wafer placement surface 22*a* is adjustable by adjusting the positions of the first flow path section 36 and the second flow path section 37. Similarly, even when d1>d3, as mentioned above, the cooling efficiency is likely to reduce in part of the second flow path section 37, where the gas intermediate passages 62*b*, 63*b* or the gas supply passages 62*c*, 63*c* are present immediately above the part. Thus, for example, the cooling efficiency of the wafer placement surface 22*a* achieved by the first flow path section 36 can be increased by decreasing the difference between the distance d1 and the distance d3, or conversely, the cooling efficiency of the wafer placement surface 22*a* achieved by the second flow path section 37 can be increased by increasing the difference between the distance d1 and the distance d3.

In the above-described embodiment, as illustrated in FIG. 2, the most part of the first flow path section 36 overlaps with the gas intermediate passage 61*b* (particularly, the gas distribution passage 71*b*) at the position overlapping with the virtual circle C1 in a top view, and the most part of the second flow path section 37 overlaps with the gas intermediate passages 62*b*, 63*b* (particularly, the gas distribution passages 72*b*, 73*b*) at the position overlapping with the virtual circles C2, C3, but the configuration is not limited thereto. It is sufficient that the first flow path section 36 be located above the gas intermediate passage 61*b* (i.e., d2<D1 is satisfied), and the second flow path section 37 be located below the gas intermediate passages 62*b*, 63*b* (i.e., D2<d3 is satisfied). For example, the first flow path section 36 and the gas intermediate passage 61*b* may be disposed to be displaced or intersect in a top view. Note that it is preferable that at least part of the first flow path section 36 be located immediately above the gas intermediate passage 61$b$, and at least part of the second flow path section 37 be located immediately below at least one of the gas intermediate passages 62$b$, 63$b$.

In the above-described embodiment, each of the distances d1, d2 is assumed to have the same value at any position of the first flow path section 36 (the value of each of the distances d1, d2 does not change over the entire first flow path section 36), but the configuration is not limited thereto. At least one of the distances d1, d2 may not be constant over the entire first flow path section 36, and may be short or long in part of the first flow path section 36. The same applies to the distances d3, d4 and the distances D1, D2. When one or more of the distances d1 to d4, D1, D2 are not constant and have a changeable value like this, in the above-mentioned magnitude relationships between distances, when there is a magnitude relationship which is satisfied in each of comparison between minimum values and comparison between maximum values, the magnitude relationship is assumed to be satisfied. For example, in the case where the distances d1, d3 are both changeable values, when the minimum value of the distance d1 is smaller than the minimum value of the distance d3, and the maximum value of the distance d1 is smaller than the maximum value of the distance d3, it is regarded that d1<d3 is satisfied. When the value of a distance does not change (constant), each of the maximum value and the minimum value is a constant value. However, the above-mentioned magnitude relationships between distances are preferably satisfied even when any two changeable values are compared. For example, in the case where the distances d1, d3 are both changeable values, when the minimum value of the distance d1 is smaller than the minimum value of the distance d3, and the maximum value of the distance d1 is smaller than the maximum value of the distance d3, it is regarded that d1<d3 is satisfied, and it is further preferable that the maximum value of the distance d1 be smaller than the minimum value of the distance d3.

In the above-described embodiment, the refrigerant flow path 32 may further have a portion which is neither the first flow path section 36 nor the second flow path section 37. For example, in the overlapping portion (central two portions between six cross sections of the second flow path section 37 illustrated in FIG. 1) with the virtual circles C3, C4 illustrated in FIG. 2 and FIG. 4 of the second flow path section 37, the distance from the wafer placement surface 22$a$ to the upper base of the portion may be shorter than the distance D2. In this case, the upper base of the portion is located above the lower bases of the gas intermediate passages 62$b$, 63$b$, and the lower base of the portion is located below the upper base of the gas intermediate passage 61$b$, thus the portion is different from the first flow path section 36 nor the second flow path section 37.

In the above-described embodiment, the first flow path section 36 is formed by the bottomed grooves provided in the upper surface of the second plate section 82, and bottomed grooves provided in the lower surface of the third plate section 83 at positions opposed to the bottomed grooves, but the configuration is not limited thereto. For example, the first flow path section 36 may be formed by the bottomed grooves provided in the upper surface of the second plate section 82 and the lower surface of the third plate section 83, or may be formed by the bottomed grooves provided in the lower surface of the third plate section 83 and the upper surface of the second plate section 82, or may be formed by the through-grooves that penetrates the third plate section 83 vertically, the lower surface of the resin bonding layer 40 and the upper surface of the second plate section 82. Similarly, the second flow path section 37 is formed by the bottomed grooves provided in the upper surface of the first plate section 81, and bottomed grooves provided in the lower surface of the second plate section 82 at positions opposed to the bottomed grooves, but the configuration is not limited to thereto. For example, the second flow path section 37 may be formed by the bottomed grooves provided in the upper surface of the first plate section 81 and the lower surface of the second plate section 82, or may be formed by the bottomed grooves provided in the lower surface of the second plate section 82 and the upper surface of the third plate section 83.

In the above-described embodiment, the distance d1 is shorter than the distance D2 in FIG. 1 (i.e., d1<D2 is satisfied), but as described above, the distance d1 and the distance D2 may be the same. For example, the first flow path section 36 may be formed by the bottomed grooves provided in the upper surface of the second plate section 82 and the lower surface of the third plate section 83, and the second gas intermediate passage (for example, at least one of the gas intermediate passage 62$b$ and the gas intermediate passage 63$b$) may be formed by the bottomed grooves provided in the lower surface of the third plate section 83 and the upper surface of the second plate section 82. In this case, the upper base of the first flow path section 36 and the lower base of the second gas intermediate passage are both located at the interface between the second plate section 82 and the third plate section 83, thus the distance d1 and the distance D2 are the same. Similarly, the distance d4 and the distance D1 may be the same.

In the above-described embodiment, the second passage 62 and the third passage 63 each correspond to a second gas passage, and the gas intermediate passage 62$b$ and the gas intermediate passage 63$b$ each correspond to a second gas intermediate passage. Specifically, in the above-described embodiment, two second gas passages each including the second gas intermediate passage are provided. However, without being limited to this, at least one second gas passage including the second gas intermediate passage may be provided. For example, the wafer placement table 10 may include only one of the second passage 62 and the third passage 63. In addition, two of the gas intermediate passages 61$b$ to 63$b$ may correspond to the first gas intermediate passage and the second gas intermediate passage of the present invention. For example, when the gas intermediate passage 63$b$ is provided above the gas intermediate passage 62$b$, the gas intermediate passage 62$b$ may correspond to the first gas intermediate passage, and the gas intermediate passage 63$b$ may correspond to the second gas intermediate passage.

In the above-described embodiment, the first flow path section 36 is provided in the vicinity of the outer periphery of the wafer placement surface 22$a$, and the second flow path section 37 is provided closer to the center of the wafer placement surface 22$a$ than the first flow path section 36 in a top view, but the configuration is not limited thereto. The first flow path section 36 and the second flow path section 37 may be provided at any position according to a desired temperature distribution of the wafer placement surface 22$a$.

In the above-described embodiment, the width w of the refrigerant flow path 32 is not constant over the entire refrigerant flow path 32, and changes in part; however, without being limited to this, the width w may be constant over the entire refrigerant flow path 32.

In the above-described embodiment, the refrigerant flow path 32 is formed in a spiral shape, but the configuration is not limited thereto. For example, the refrigerant flow path 32 may be formed in a zigzag shape.

In the above-described embodiment, the number of gas introduction passages 61*a* is smaller than the number of gas supply passages 61*c* and the number of first penetration sections 51, but the configuration is not limited thereto. For example, the number of gas introduction passages 61*a* may be the same as the number of gas supply passages 61*c* and the number of first penetration sections 51. The same applies to the number of gas introduction passages 62*a* and the number of gas introduction passages 63*a*.

In the above-described embodiment, the first to third penetration sections 51 to 53 of the ceramic plate penetration section 50 are each a hole that penetrates the ceramic plate 20 in the up-down direction, but the configuration is not limited thereto. For example, one or more of the first to third penetration sections 51 to 53 may have a bending portion inside the ceramic plate 20.

Although the ceramic plate 20 contains the wafer attracting electrode 26 in the embodiments described above, the ceramic plate 20 may contain a RF electrode for plasma generation or a heater electrode (resistance heating element), instead of, or in addition to, the wafer attracting electrode 26. The outer peripheral portion 24 of the ceramic plate 20 may contain a focus ring (FR) attracting electrode, a RF electrode, or a heater electrode.

In the embodiments described above, the ceramic plate 20 is made by hot-press firing a ceramic powder molded body. The molded body may be made by stacking a plurality of tape-cast layers, by a mold casting method, or by compacting ceramic powder.

In the above-described embodiment, the wafer placement table 10 may have a plurality of lift pin holes that penetrate the wafer placement table 10 vertically. A lift pin hole is a hole for inserting a lift pin to move the wafer W vertically with respect to the wafer placement surface 22*a*. For example, when the wafer placement surface 22*a* is seen in a plan view, a plurality of lift pin holes are provided at regular intervals along a concentric circle of the wafer placement surface 22*a*.

International Application No. PCT/JP2023/016096, filed on Apr. 24, 2023, is incorporated herein by reference in its entirety.

What is claimed is:

1. A wafer placement table comprising:
   a ceramic plate having a wafer placement surface at an upper surface and incorporating an electrode;
   a cooling plate having a refrigerant flow path and being provided on a lower surface-side of the ceramic plate;
   a first ceramic plate penetration section that penetrates the ceramic plate in an up-down direction and reaches the wafer placement surface;
   a second ceramic plate penetration section that penetrates the ceramic plate in the up-down direction and reaches the wafer placement surface;
   a first gas passage that is provided at least inside the cooling plate, and communicates with the first ceramic plate penetration section; and
   a second gas passage that is provided at least inside the cooling plate, and communicates with the second ceramic plate penetration section,
   wherein the first gas passage has a first gas intermediate passage extending in a direction intersecting the up-down direction, the second gas passage has a second gas intermediate passage extending in a direction intersecting the up-down direction,
   the second gas intermediate passage is provided above the first gas intermediate passage,
   the refrigerant flow path has a first flow path section provided above the first gas intermediate passage, and a second flow path section provided below the second gas intermediate passage,
   wherein a plurality of first ceramic plate penetration sections, each of which is the first ceramic plate penetration section, and a plurality of second ceramic plate penetration sections, each of which is the second ceramic plate penetration section are provided,
   the first gas intermediate passage communicates with the plurality of first ceramic plate penetration sections,
   the second gas intermediate passage communicates with the plurality of second ceramic plate penetration sections,
   the first gas passage has one or more first gas introduction passages provided to communicate with the first gas intermediate passage, the one or more first gas introduction passages being smaller in number than a number of the plurality of first ceramic plate penetration sections, and
   the second gas passage has second gas introduction passages provided to communicate with the second gas intermediate passage, the one or more second gas introduction passages being smaller in number than a number of the plurality of second ceramic plate penetration sections.

2. The wafer placement table according to claim 1, wherein a distance from the wafer placement surface to an upper base of the first flow path section is shorter than a distance from the wafer placement surface to an upper base of the second flow path section.

3. The wafer placement table according to claim 1, wherein the distance from the wafer placement surface to the upper base of the first flow path section is equal to or shorter than a distance from the wafer placement surface to a lower base of the second gas intermediate passage.

4. The wafer placement table according to claim 1, wherein the cooling plate has n plate sections, the n being an integer greater than or equal to two,
   the wafer placement table includes first to (n−1)th bonding sections, in each of which two adjacent plates of the n plate sections are bonded to each other directly or via a bonding layer, and a nth bonding section in which the ceramic plate and the cooling plate are bonded directly or via a bonding layer,
   the first gas intermediate passage is provided in one of the first to (n−1)th bonding sections, and
   the second gas intermediate passage is provided in a bonding section of the first to nth bonding sections, the bonding section being above the first gas intermediate passage.

5. The wafer placement table according to claim 1, wherein a main component of the ceramic plate is alumina, and
   a main component of the cooling plate is titanium.

* * * * *